US011434569B2

(12) United States Patent
Nguyen et al.

(10) Patent No.: US 11,434,569 B2
(45) Date of Patent: Sep. 6, 2022

(54) GROUND PATH SYSTEMS FOR PROVIDING A SHORTER AND SYMMETRICAL GROUND PATH

(71) Applicant: Applied Materials, Inc., Santa Clara, CA (US)

(72) Inventors: Tuan Anh Nguyen, San Jose, CA (US); Jason M. Schaller, Austin, TX (US); Edward P. Hammond, IV, Hillsborough, CA (US); David Blahnik, Round Rock, TX (US); Tejas Ulavi, San Jose, CA (US); Amit Kumar Bansal, Milpitas, CA (US); Sanjeev Baluja, Campbell, CA (US); Jun Ma, Milpitas, CA (US); Juan Carlos Rocha, San Carlos, CA (US)

(73) Assignee: Applied Materials, Inc., Santa Clara, CA (US)

(*) Notice: Subject to any disclaimer, the term of this patent is extended or adjusted under 35 U.S.C. 154(b) by 313 days.

(21) Appl. No.: 16/400,054

(22) Filed: May 1, 2019

(65) Prior Publication Data
US 2019/0360100 A1 Nov. 28, 2019

Related U.S. Application Data

(60) Provisional application No. 62/676,891, filed on May 25, 2018.

(51) Int. Cl.
*C23C 16/505* (2006.01)
*C23C 16/44* (2006.01)
*C23C 16/458* (2006.01)

(52) U.S. Cl.
CPC ........ *C23C 16/505* (2013.01); *C23C 16/4404* (2013.01); *C23C 16/4581* (2013.01)

(58) Field of Classification Search
USPC .................................. 156/345.47; 118/723 e
See application file for complete search history.

(56) References Cited

U.S. PATENT DOCUMENTS

| 5,951,776 A * | 9/1999 | Selyutin .............. C23C 16/4583 |
| | | 118/729 |
| 10,049,862 B2 | 8/2018 | Brown et al. |
| 2004/0182515 A1 * | 9/2004 | Sato .................. H01J 37/32568 |
| | | 156/345.43 |

(Continued)

FOREIGN PATENT DOCUMENTS

| JP | H10-079350 A | 3/1998 |
| JP | 2010-161316 A | 7/2010 |

OTHER PUBLICATIONS

PCT Notification of Transmittal of the International Search Report and the Written Opinion of the International Searching Authority for International Application No. PCT/US2019/030733; dated Aug. 22, 2019; 15 total pages.

*Primary Examiner* — Ram N Kackar
(74) *Attorney, Agent, or Firm* — Patterson + Sheridan, LLP

(57) ABSTRACT

Embodiments described herein relate to ground path systems providing a shorter and symmetrical path for radio frequency (RF) energy to propagate to a ground to reduce generation of the parasitic plasma. The ground path system bifurcates the processing volume of the chamber to form an inner volume that isolates an outer volume of the processing volume.

20 Claims, 4 Drawing Sheets

(56) References Cited

U.S. PATENT DOCUMENTS

| | | | |
|---|---|---|---|
| 2007/0116872 A1* | 5/2007 | Li | C23C 16/45536 427/248.1 |
| 2010/0000684 A1 | 1/2010 | Choi | |
| 2011/0294303 A1 | 12/2011 | Sankarakrishnan et al. | |
| 2014/0130743 A1* | 5/2014 | Toriya | C23C 16/4412 118/725 |
| 2018/0323044 A1 | 11/2018 | Brown et al. | |

* cited by examiner

GROUND PATH SYSTEMS FOR PROVIDING A SHORTER AND SYMMETRICAL GROUND PATH

CROSS-REFERENCE TO RELATED APPLICATIONS

This application claims benefit of U.S. Provisional Patent Application Ser. No. 62/676,891, filed May 25, 2018, which is herein incorporated by reference.

BACKGROUND

Field

Embodiments of the present disclosure generally relate to process chambers, such as chemical vapor deposition chambers. More particularly, embodiments of the present disclosure relate to ground path systems providing a shorter and symmetrical path for radio frequency (RF) energy to propagate to a ground.

Description of the Related Art

Chemical vapor deposition (CVD) is generally employed to deposit a film on a substrate, such as a semiconductor wafer or transparent substrate used for flat panel displays. CVD is generally accomplished by introducing process gasses into a vacuum chamber that contains a substrate. The precursor gas or gas mixture is typically directed downwardly through a gas distribution assembly situated near the top of the chamber. The gas distribution assembly is placed above a substrate that is positioned on a heated pedestal at a small distance such that the gas distribution assembly and the process gasses are heated by the radiated heat from the pedestal.

During CVD the process gasses in the chamber may be energized (e.g., excited) into a plasma by applying radio frequency (RF) power to the chamber from one or more RF sources coupled to the chamber, referred to as plasma-enhanced CVD (PECVD). A RF source coupled to the pedestal through a RF matching circuit and a faceplate of the gas distribution assembly grounded to the chamber body facilitate formation of a capacitive plasma coupling. The RF source provides RF energy to the pedestal to facilitate generation of the capacitive coupled plasma, also known as a main plasma, between the pedestal and the faceplate of the gas distribution assembly. However, a parasitic plasma, also known as a secondary plasma, may be generated underneath the pedestal in a lower volume of the vacuum chamber as a byproduct of generating the capacitive coupled plasma and ground path of the faceplate. The parasitic plasma reduces the concentration of the capacitive coupled plasma, and thus reduces the density of the capacitive coupled plasma which reduces the deposition rate of the film. Furthermore, variation of the concentration and density of the parasitic plasma between chambers reduces the uniformity between films formed in separate chambers.

Accordingly, what are needed in the art are ground path systems for reducing the generation of the parasitic plasma.

SUMMARY

In one embodiment, a ground path system is provided. The ground path system includes a ground bowl and a bottom bowl configured to be disposed in a chamber. The chamber includes a processing volume, and a pedestal disposed in the processing volume by a stem coupled to a lift system configured to move the pedestal between an elevated processing position and a lowered position. The ground bowl is coupled to the stem and the pedestal by a thermal barrier. A bottom bowl carrier is coupled to a track. The bottom bowl carrier configured to move linearly along the track to move the bottom bowl between a ground position and a transfer position. The bottom bowl is coupled to the ground bowl by a ground bowl conductor, and the bottom bowl is coupled to the chamber by a bottom bowl conductor.

In another embodiment, a ground path system is provided. The ground path system includes a ground bowl configured to be disposed in a chamber. The chamber includes a processing volume, and a pedestal disposed in the processing volume by a stem coupled to a cooling hub connected to a lift system configured to move the pedestal between an elevated processing position and a lowered position. The ground bowl is coupled to the cooling hub. A ground bowl conductor is coupled to the ground bowl. The ground bowl conductor is in a compressed state when the pedestal and the ground bowl are in the elevated processing position and in an expanded state when the pedestal and ground bowl are in the lowered position.

In yet another embodiment, a chamber is provided. The chamber includes a chamber body having a processing volume, and a pedestal disposed in the processing volume by a stem coupled to a cooling hub connected to move the pedestal between an elevated processing position and a lowered position. A ground path system is disposed in the chamber body. The ground path system includes a ground bowl coupled to the stem and the pedestal by a thermal barrier and coupled to the cooling hub. A bottom bowl is coupled to the ground bowl by a ground bowl conductor and coupled to the chamber by a bottom bowl conductor. A bottom bowl carrier is coupled to a track. The bottom bowl carrier is configured to move linearly along the track to move the bottom bowl between a ground position and a transfer position.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to ground path systems providing a shorter and symmetrical path for radio frequency (RF) energy to propagate to a ground to reduce generation of the parasitic plasma, and thus increase deposition rate and improve film uniformity. The ground path system bifurcates the processing volume of the chamber to form an inner volume that isolates the processing region from the outer volume of the processing volume providing a reduced surface area for RF energy to propagate and eliminates any non-symmetries of the chamber body. Therefore, the concentration of the capacitive coupled plasma is increased, and thus the density of the capacitive coupled plasma is increased.

Figure 1A:
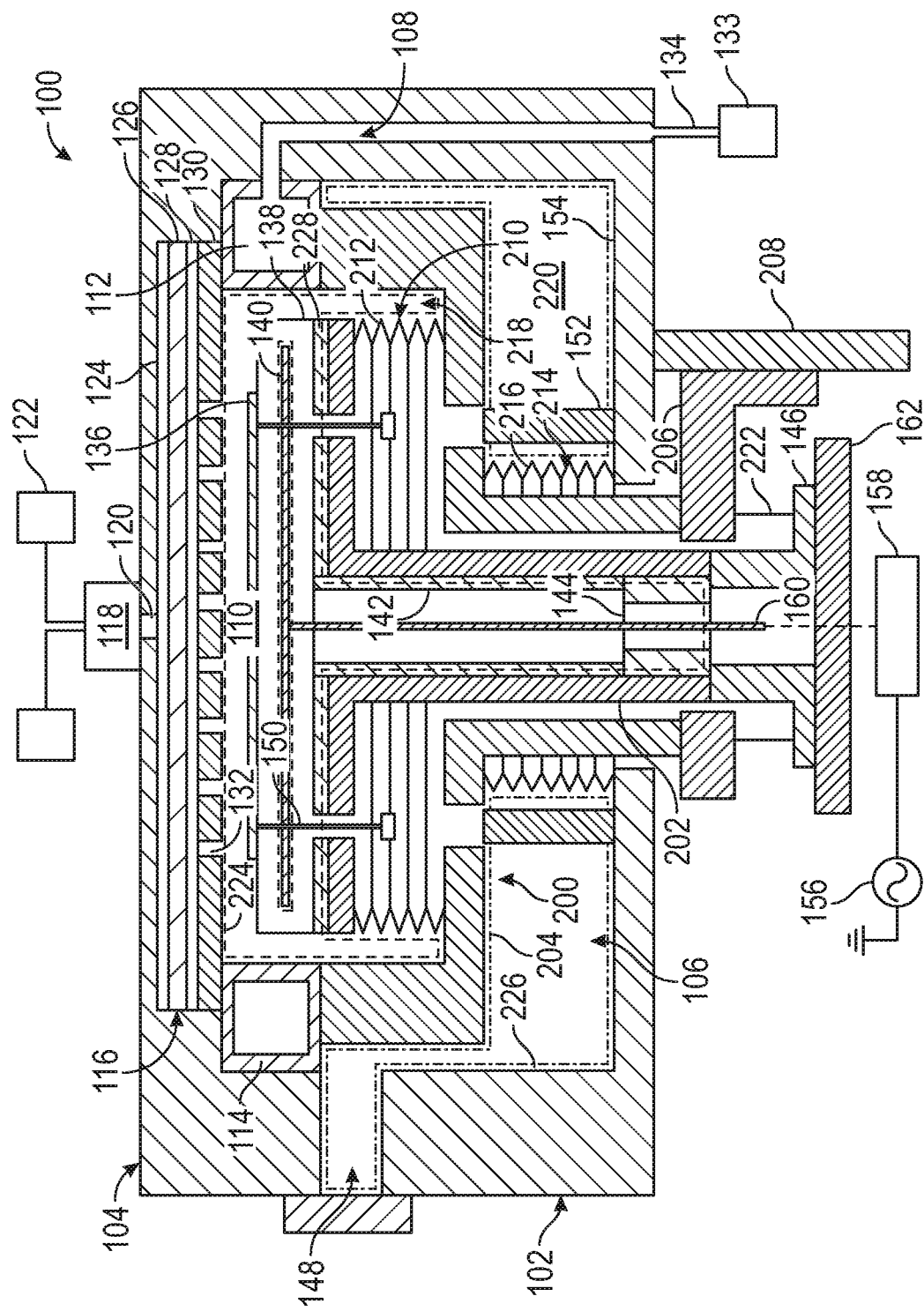
FIG. 1A is a schematic cross-sectional view of a chemical vapor deposition chamber having a ground path system disposed therein according to an embodiment.
Figure 1B:
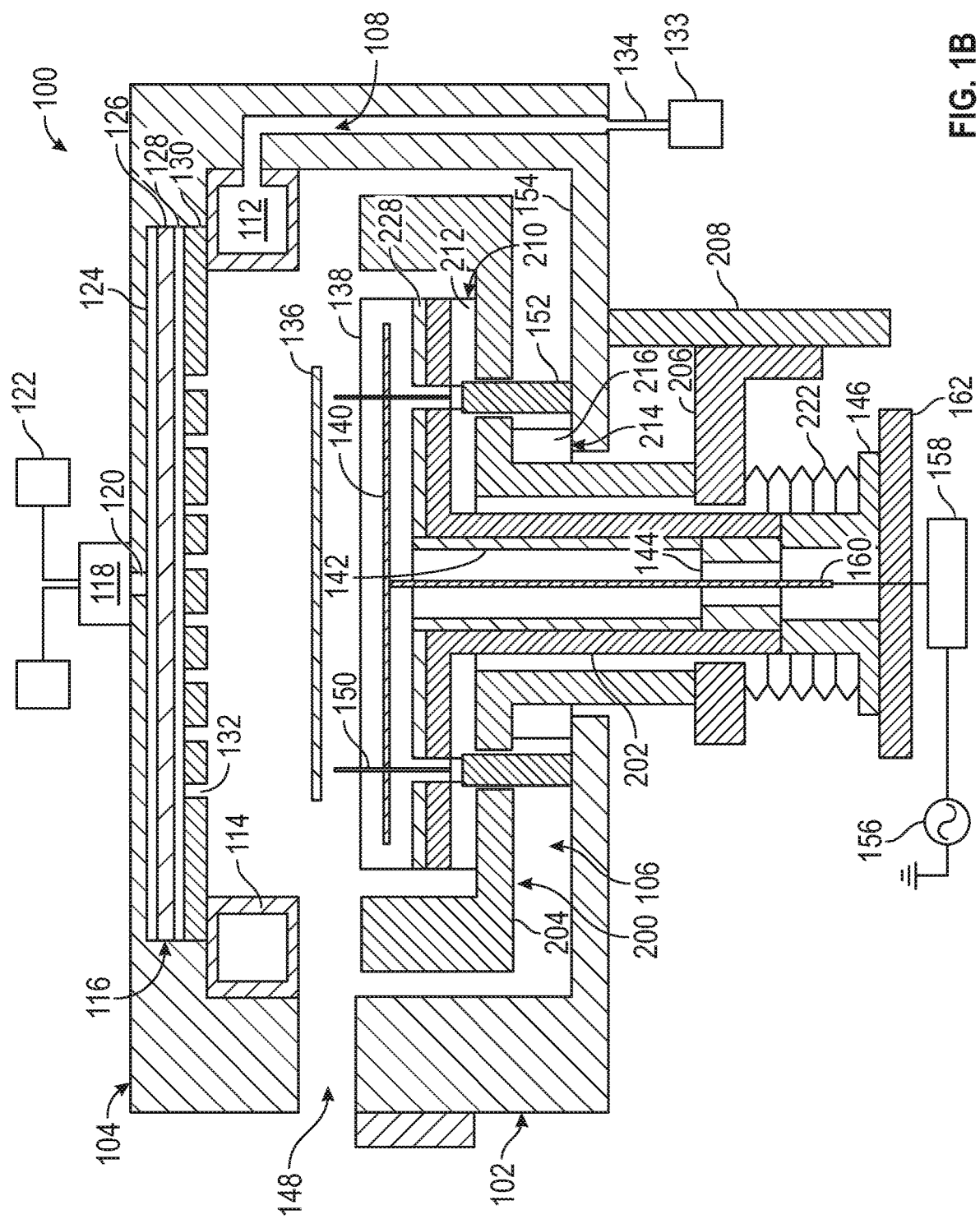
FIG. 1B is a schematic cross-sectional view of a chemical vapor deposition chamber having a ground path system disposed therein according to an embodiment.

FIG. 1A and FIG. 1B are schematic cross-sectional views of a chemical vapor deposition (CVD) chamber 100 having a ground path system 200 disposed therein. One example of the chamber 100 is a PRECISION™ chamber manufactured by Applied Materials, Inc., located in Santa Clara, Calif. The chamber 100 has a chamber body 102 and a chamber lid 104. The chamber body includes processing volume 106 and a pumping path 108. The processing volume 106 is the space defined by the chamber body and the chamber lid 104, and the pumping path 108 is a path formed in the chamber body 102 coupled to a pumping volume 112 formed in a pumping plate 114.

The chamber 100 includes a gas distribution assembly 116 disposed through the chamber lid 104 to deliver a flow of one or more gases into a processing region 110 described in detail herein. The gas distribution assembly 116 includes a gas manifold 118 coupled to a gas inlet passage 120 formed in the chamber lid 104. The gas manifold 118 receives the flow of gases from one or more gas sources 122. The flow of gases distributes across a gas box 124, flows through a plurality of holes (not shown) of a backing plate 126, and further distributes across a plenum 128 defined by the backing plate 126 and a faceplate 130. The flow of gases then flows into a processing region 110 of the processing volume 106 through a plurality of holes 132 of the faceplate 130. A pump 133 is connected to the pumping path 108 by a conduit 134 to control the pressure within the processing region 110 and to the exhaust gases and byproducts from the processing region 110 through the pumping volume 112 and pumping path 108.

The processing volume 106 includes a pedestal 138 for supporting a substrate 136 within the chamber 100. The pedestal 138 includes a heating element (not shown) and an electrode 140 disposed within. In one embodiment, which can be combined with other embodiments described herein, the electrode 140 includes a conductive mesh, such as a tungsten-, copper-, or molybdenum-containing conductive mesh. The pedestal 138 is movably disposed in the processing volume 106 by a stem 142 coupled to a heater clamp 144. The heater clamp 144 is coupled to a cooling hub 146. The cooling hub 146 is connected to a lift system 162 that moves the pedestal 138 between an elevated processing position (shown in FIG. 1A) and a lowered position (shown in FIG. 1B). Movement of the pedestal 138 facilitates transfer of the substrate 136 to and from the processing volume 106 through a slit valve 148 formed though the chamber body 102. The elevated processing position corresponds to the processing region 110 defined by the pedestal 138 and faceplate 130 of the gas distribution assembly 116. The pedestal 138 has holes disposed therethrough, through which a plurality of lift pins 150 are movably disposed. In the lowered position, the plurality of lift pins 150 are projected from the pedestal 138 by contacting a lift plate 152 coupled to a bottom 154 of the chamber body. Projection of the lift pins 150 places the substrate 136 in a spaced-apart relation from the pedestal to facilitate the transfer of the substrate 136.

A RF source 156 is coupled to the electrode 140 disposed within pedestal 138 through a RF matching circuit 158. The RF matching circuit 158 is electrically coupled to the electrode 140 by a conductive rod 160 disposed through the cooling hub 146 and stem 142. The faceplate 130, which is grounded via the ground path system 200, and the electrode 140 facilitate formation of a capacitive plasma coupling. The RF source 156 provides RF energy to the pedestal 138 to facilitate generation of a capacitive coupled plasma, also known as a main plasma, between the pedestal 138 and the faceplate 130 of the gas distribution assembly 116. When RF power is supplied to the electrode 140, an electric filed is generated between the faceplate 130 and pedestal 138 such that atoms of gases present in the processing region 110 between the pedestal 138 and the faceplate 130 are ionized and release electrons. The ionized atoms accelerated to the pedestal 138 to facilitate film formation on the substrate 136.

The ground path system 200 provides a short and symmetrical path for RF energy to propagate from the faceplate 130 to the RF matching circuit 158 to reduce generation of the parasitic plasma, and thus increase deposition rate and improve film uniformity. The ground path system 200 includes a ground bowl 202, and a bottom bowl 204. The ground bowl 202 is coupled to the stem 142 and the pedestal 138 by a thermal barrier 228. The thermal barrier 228 provides a barrier to the pedestal 138 that may be heated up to a temperature greater than about 700° C. The thermal barrier 228 includes materials having a low thermal conductivity. In one embodiment, which can be combined with other embodiments described herein, the thermal barrier 228 includes one or more of inconel, quartz, aluminum oxide, aluminum nitride, and stainless steel containing materials to provide a barrier to the temperature.

The ground bowl 202 is also coupled to the cooling hub 146 that is connected to the lift system 162. The lift system 162 moves the ground bowl 202 between the elevated processing position (shown in FIG. 1A) and the lowered position (shown in FIG. 1B), facilitating transfer of the substrate 136. The ground bowl 202 includes conductive materials capable of withstanding a temperature in the processing volume 106 greater than about 700° C. and process environment in the processing volume 106. In one embodiment, which can be combined with other embodiments described herein, the ground bowl 202 includes one or more of inconel, aluminum, and stainless steel containing materials. The bottom bowl 204 is coupled to a bottom bowl carrier 206. The bottom bowl carrier 206 is coupled to a track 208. The bottom bowl carrier 206 is actuated to move linearly along the track 208 to move the bottom bowl 204 between a ground position (shown in FIG. 1A) and a transfer position (shown in FIG. 1B). The track 208 may also be a rail or cable. The bottom bowl carrier 206 includes conductive materials capable of withstanding the temperature and process environment in the processing volume 106. In one embodiment, which can be combined with other embodiments described herein, the bottom bowl 204 includes one or more of inconel, aluminum, and stainless steel containing materials.

The ground bowl 202 is coupled to the bottom bowl 204 via the ground bowl conductor 210. The ground bowl conductor is in an expanded state when the pedestal 138 and ground bowl 202 are in the elevated processing position and a compressed state when the pedestal 138 and ground bowl 202 are in the lowered position. The ground bowl conductor 210 in the expanded state provides a path for RF energy to propagate. The ground bowl conductor 210 includes conductive materials capable of withstanding the temperature and process environment in the processing volume 106. In one embodiment, which can be combined with other embodiments described herein, the ground bowl conductor 210 includes one or more of nickel-base alloy (e.g., HAYNES® 230® alloy), inconel, and stainless steel containing materials. In another embodiment, which can be combined with other embodiments described herein, the ground bowl conductor 210 includes a plurality of bellows 212 that expand in the expanded state and compress in the compressed state.

The bottom bowl 204 is coupled to the bottom 154 of the chamber body 102 via the bottom bowl conductor 214. The bottom bowl 204 is in the expanded state when the bottom bowl 204 is in the ground position and the compressed state when the bottom bowl 204 is in the transfer position. The bottom bowl conductor 214 in the expanded state provides a path for RF energy to propagate. The bottom bowl conductor 214 includes conductive materials capable of withstanding the temperature and process environment in the processing volume 106. In one embodiment, which can be combined with other embodiments described herein, the ground bowl conductor 210 includes one or more of nickel-base alloy (e.g., HAYNES® 230® alloy), inconel, and stainless steel containing materials. In another embodiment, which can be combined with other embodiments described herein, the bottom bowl conductor 214 includes a plurality of bellows 216 that expand in the expanded state and compress in the compressed state. The cooling hub 146 is coupled to the bottom bowl carrier 206 by a plurality of bellows 222 to maintain the pressure within processing volume 106.

The ground bowl 202 in the lowered position and the bottom bowl 204 in the transfer position (shown in FIG. 1B) facilitate transfer of the substrate 136 to and from the processing volume 106 through a slit valve 148 formed though the chamber body 102. The ground bowl 202 in the elevated processing position and the bottom bowl 204 in the ground position (shown in FIG. 1A) bifurcates the processing volume 106 to form an inner volume 218 of the processing volume 106 that isolates the processing region 110 from the outer volume 220 of the processing volume 106. Isolating the inner volume 218 from the outer volume 220 of the processing volume 106 provides a reduced surface area for RF energy to propagate and eliminates non-symmetries of the chamber body 102, such as those caused by the presence of the slit valve 148, that may cause the formation of a parasitic plasma.

Furthermore, the bottom bowl 204 in the ground position contacts the pumping plate 114 to complete a primary RF cage 224 for RF energy to propagate from the faceplate 130 to the RF matching circuit 158. In the inner volume 218, RF energy propagates along the primary RF cage 224 from the faceplate 130 to the pumping plate 114, from the bottom bowl 204 to the ground bowl conductor 210, from the ground bowl conductor 210 to the ground bowl 202, and from the ground bowl 202 to the conductive rod 160. The primary RF cage 224, formed by the bottom bowl 204 in the ground position contacting the pumping plate 114, utilizes the reduced surface area to enable a shorter and more controlled ground path so that parasitic plasma is not generated underneath the pedestal 138 in the inner volume 218. Therefore, the concentration of the capacitive coupled plasma is increased, and thus the density of the capacitive coupled plasma is increased, which increases the deposition rate of the film. Furthermore, the primary RF cage 224 is substantially symmetrical to improve the uniformity of the capacitive coupled plasma to improve the uniformity of the deposited film.

Additionally, the bottom bowl 204 in the ground position forms a secondary RF cage 226 in the outer volume 220 if the bottom bowl 204 in the ground position does not contact the pumping plate 114. The secondary RF cage provides containment of RF energy. In the outer volume 220, RF energy propagates along the secondary RF cage 226 from the chamber body 102 to the bottom bowl conductor 214, from the bottom bowl conductor 214 to the bottom bowl 204, and from the bottom bowl 204 to the primary RF cage 224.

Figure 1C:
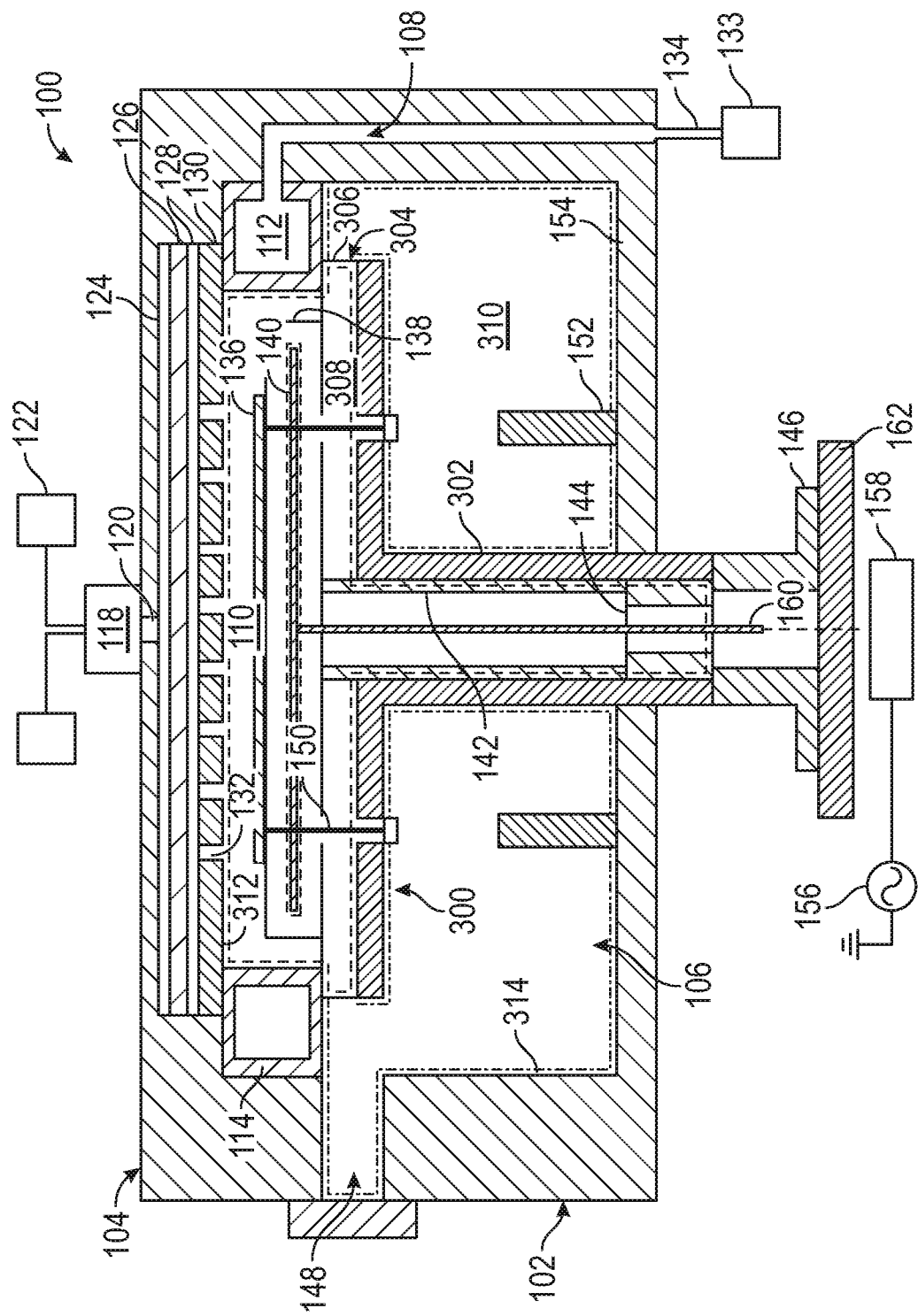
FIG. 1C is a schematic cross-sectional view of a chemical vapor deposition chamber having a ground path system disposed therein according to an embodiment.
Figure 1D:
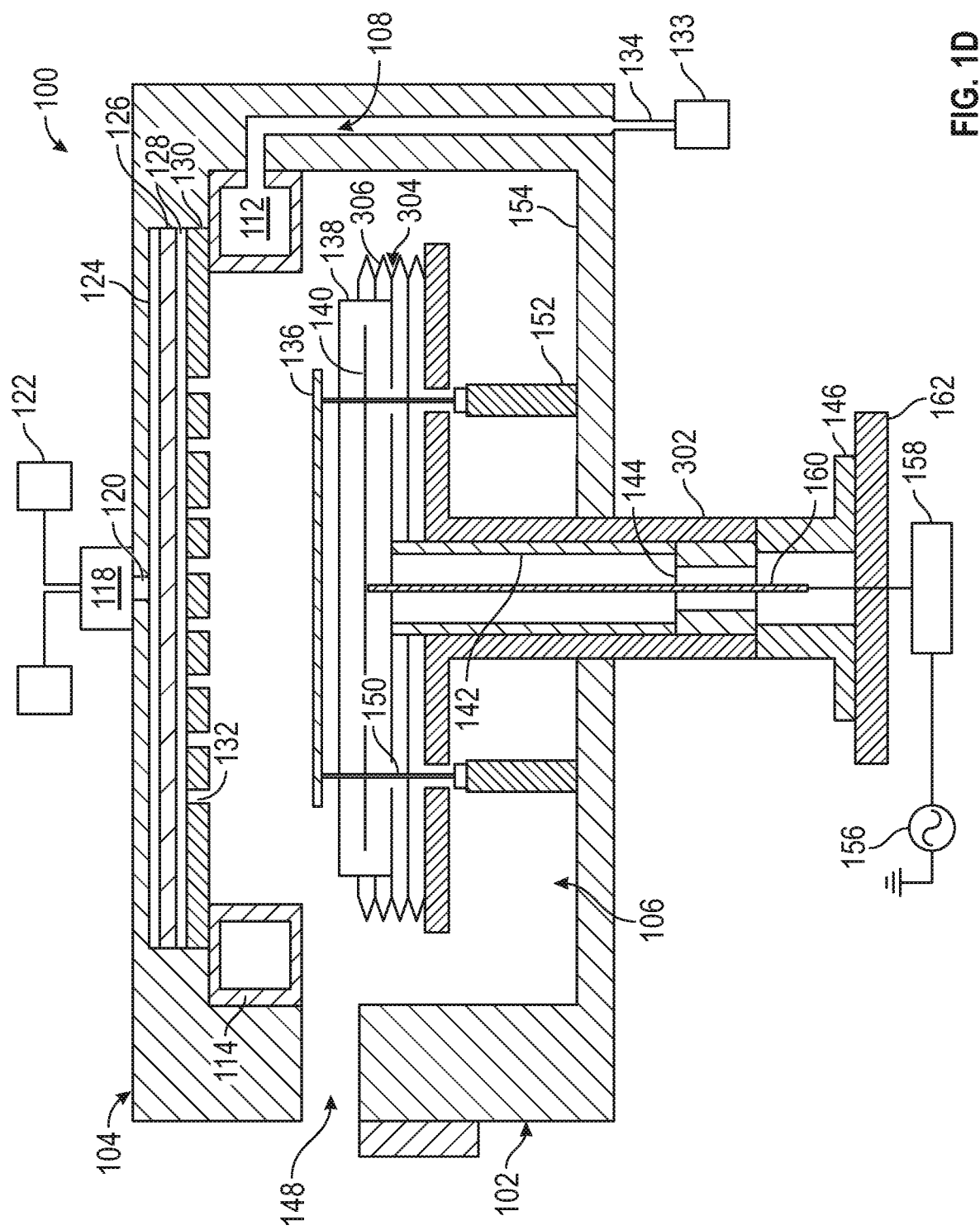
FIG. 1D is a schematic cross-sectional view of a chemical vapor deposition chamber having a ground path system disposed therein according to an embodiment.

FIG. 1C and FIG. 1D are schematic cross-sectional views of a CVD chamber 100 having a ground path system 300 disposed therein. The faceplate 130, grounded via the ground path system 300 and the electrode 140, facilitate formation of a capacitive plasma coupling. The ground path system 300 provides a short and symmetrical path for radio frequency (RF) energy to propagate from the faceplate 130 to the RF matching circuit 158 to reduce generation of the parasitic plasma, and thus increase deposition rate and improve film uniformity.

The ground path system 300 includes a ground bowl 302. The ground bowl 302 is coupled to the cooling hub 146. The cooling hub 146 is connected to the lift system 162 that moves the ground bowl 302 between the elevated processing position (shown in FIG. 1C) and the lowered position (shown in FIG. 1D) that facilitates transfer of the substrate 136. The ground bowl 302 is separated from the pedestal 138. The ground bowl 302 includes conductive materials capable of withstanding a temperature in the processing volume 106 greater than about 700° C. and capable of withstanding a process environment in the process volume 106. In one embodiment, which can be combined with other embodiments described herein, the ground bowl 302 one or more of includes inconel, aluminum, and stainless steel containing materials.

The ground bowl 302 is coupled to a ground bowl conductor 304. The ground bowl conductor 304 is in a compressed state when the pedestal 138 and ground bowl 302 are in the elevated processing position and an expanded state when the pedestal 138 and ground bowl 302 are in the lowered position. The ground bowl conductor 304 in the compressed state provides a path for RF energy to propagate. The ground bowl conductor 304 includes conductive materials capable of withstanding the temperature in the processing volume 106. In one embodiment, the ground bowl conductor 304 includes one or more of nickel-base alloy (e.g., HAYNES® 230® alloy), inconel, and stainless steel containing materials. In another embodiment, which can be combined with other embodiments described herein, the ground bowl conductor 304 includes a plurality of bellows 306 that expand in the expanded state and compress in the compressed state.

The ground bowl 304 in the lowered position (shown in FIG. 1D) facilitates transfer of the substrate 136 to and from the processing volume 106 through a slit valve 148 formed though the chamber body 102. The ground bowl 304 in the elevated processing position (shown in FIG. 1C) bifurcates the processing volume 106 to form an inner volume 308 of the processing volume 106 that isolates the processing region 110 from the outer volume 310 of the processing volume 106. Isolating the inner volume 308 from the outer volume 310 of the processing volume 106 provides a reduced surface area for RF energy to propagate and eliminates non-symmetries of the chamber body 102, such as those caused by presence of the slit valve 148. Non-symmetries of the chamber body 102 may cause the formation of a parasitic plasma.

Furthermore, when the pedestal 138 and the ground bowl 302 are in the elevated processing position, the ground bowl conductor 304 in a compressed state contacts the pumping plate 114 to complete a primary RF cage 312 for RF energy to propagate from the faceplate 130 to the RF matching circuit 158. In the inner volume 308, RF energy propagates along the primary RF cage 312 from the faceplate 130 to the ground bowl conductor 304, from the ground bowl conductor 304 to the ground bowl 302, and from the ground bowl 302 to the conductive rod 160. The primary RF cage 312, formed by the ground bowl 302 in the elevated processing position contacting the pumping plate 114, utilizes the reduced surface area to enable a shorter and more controlled ground path so that parasitic plasma is not generated underneath the pedestal 138 in the inner volume 308. Therefore, the concentration of the capacitive coupled plasma is increased, and thus the density of the capacitive coupled plasma is increased which increases the deposition rate of the film. Furthermore, the primary RF cage 312 is substantially symmetrical to improve the uniformity of the capacitive coupled plasma to improve the uniformity of the deposited film.

Additionally, the ground bowl 302 in the elevated processing position forms a secondary RF cage 314 in the outer volume 310 if the ground bowl 302 (in the elevated processing position) does not contact the pumping plate 114. The secondary RF cage provides containment of RF energy. In the outer volume 310, RF energy propagates along the secondary RF cage 314 from the chamber body 102 to the ground bowl 302, and from the ground bowl 302 to the primary RF cage 312.

In summation, ground path systems are describe herein provide a shorter and symmetrical path for (RF energy to propagate to ground to reduce generation of the parasitic plasma, and thus increase deposition rate and improve film uniformity. Bifurcating the processing volume of the CVD chamber to form an inner volume that isolates the processing region from the outer volume of the processing volume provides a reduced surface area for RF energy to propagate and eliminates non-symmetries of the chamber body. Furthermore, forming a primary RF cage utilizing the reduced surface area enables a shorter and more controlled ground path so that parasitic plasma is not generated underneath the pedestal in the inner volume. Therefore, the concentration of the capacitive coupled plasma is increased, and thus the density of the capacitive coupled plasma is increased which increases the deposition rate of the film. Furthermore, the primary RF cage is substantially symmetrical to improve the uniformity of the capacitive coupled plasma to improve the uniformity of the deposited film.

While aspects herein are described with respect to CVD chambers, and plasma-enhanced configurations thereof, it is contemplated that other process chambers may benefit from aspects of the disclosure. For example, plasma process chambers may benefits from aspects described herein, including plasma process chambers such as physical vapor deposition (PVD) chambers, etch chambers, atomic layer deposition (ALD) chambers, such as plasma-enhanced ALD chambers, and the like.

While the foregoing is directed to examples of the present disclosure, other and further examples of the disclosure may be devised without departing from the basic scope thereof, and the scope thereof is determined by the claims that follow.

What is claimed is:

1. A ground path system, comprising:
a chamber having a processing volume;
a pedestal disposed in the processing volume by a stem coupled to a lift system configured to move the pedestal between an elevated processing position and a lowered position;
a ground bowl coupled to the pedestal in the processing volume and the stem, the stem disposed through an opening of the chamber;
a thermal barrier coupling the ground bowl to the pedestal;
a pumping plate disposed concentric to the pedestal in the processing volume:
a bottom bowl having a first portion disposed in the processing volume and a second portion disposed through the opening of the chamber; and
the bottom bowl is attached to a carrier, the carrier being coupled to a track, the bottom bowl carrier configured to move linearly along the track to move the bottom bowl between a ground position and a transfer position, the bottom bowl contacting the pumping plate in the ground position, the bottom bowl coupled to the ground bowl by a ground bowl conductor, and the bottom bowl coupled to the chamber by a bottom bowl conductor;
wherein the ground bowl and bottom bowl are movable with respect to each other and with respect to the lower wall of the chamber.

2. The system of claim 1, wherein the stem coupled to a heater clamp that is coupled to a hub, the hub connected to the lift system.

3. The system of claim 2, wherein the ground bowl in the elevated processing position and the bottom bowl in the ground position bifurcates the processing volume to form an inner volume of the processing volume isolated from an outer volume of the processing volume.

4. The system of claim 3, further comprising a radio frequency (RF) source coupled to an electrode disposed within the pedestal through a RF matching circuit electrically coupled to the electrode by a conductive rod disposed through the hub and the stem.

5. The system of claim 4, further comprising a faceplate disposed vertically above the pedestal.

6. The system of claim 5, wherein the bottom bowl in the ground position contacts the pumping plate of the chamber to form a primary RF cage for RF energy to propagate from the faceplate to the RF matching circuit.

7. The system of claim 1, wherein the ground bowl in the lowered position and the bottom bowl in the transfer position facilitate transfer of a substrate to and from the processing volume through a slit valve formed though the chamber.

8. A ground path system, comprising:
a chamber, the chamber having:
a processing volume; and
a pedestal disposed in the processing volume by a stem coupled to a hub connected to a lift system configured to move the pedestal between an elevated processing position and a lowered position;

a pumping plate disposed concentric to the pedestal in the processing volume;

a ground bowl configured to be disposed in the chamber and coupled to the hub, the ground bowl coupled to the pedestal in the processing volume and the stem, the stem disposed through an opening of the chamber; and a ground bowl conductor coupled to the ground bowl, the ground bowl conductor contacting the pumping plate in a compressed state when the pedestal and the ground bowl are in the elevated processing position and in an expanded state when the pedestal and ground bowl are in the lowered position;

wherein the ground bowl and bottom bowl are movable with respect to each other and with respect to the lower wall of the chamber.

9. The system of claim 8, wherein the ground bowl in the elevated processing position bifurcates the processing volume to form an inner volume of the processing volume isolated from an outer volume of the processing volume.

10. The system of claim 9, further comprising a radio frequency (RF) source coupled to an electrode disposed within the pedestal through a RF matching circuit electrically coupled to the electrode by a conductive rod disposed through the hub and the stem.

11. The system of claim 10, further comprising a faceplate disposed vertically above the pedestal.

12. The system of claim 11, wherein the ground bowl conductor is in a compressed state when the pedestal and the ground bowl in the elevated processing position contacts the pumping plate of the chamber to form a primary RF cage for RF energy to propagate from the faceplate to the RF matching circuit.

13. The system of claim 8, wherein the ground bowl in the lowered position facilitates transfer of a substrate to and from the processing volume through a slit valve formed though the chamber.

14. The system of claim 8, wherein a heater clamp is coupled to the hub.

15. A chemical vapor deposition (CVD) chamber, comprising:

a chamber body having a processing volume;

a pedestal disposed in the processing volume by a stem coupled to a hub connected to move the pedestal between an elevated processing position and a lowered position;

a pumping plate disposed concentric to the pedestal in the processing volume: and a ground path system disposed in the chamber body, the ground path system comprising:

a ground bowl coupled to the stem and the pedestal by a thermal barrier and coupled to the hub, the ground bowl coupled to the pedestal in the processing volume and the stem, the stem disposed through an opening of the chamber;

a bottom bowl coupled to the ground bowl by a ground bowl conductor and coupled to the chamber by a bottom bowl conductor, the bottom bowl having a first portion disposed in the processing volume and a second portion disposed through the opening of the chamber; and the bottom bowl is attached to a carrier, the carrier being, coupled to a track, the bottom bowl carrier configured to move linearly along the track to move the bottom bowl between a ground position and a transfer position, the bottom bowl contacting the pumping plate in the ground position;

wherein the ground bowl and bottom bowl are movable with respect to each other and with respect to the lower wall of the chamber.

16. The chamber of claim 15, wherein the ground bowl in the elevated processing position and the bottom bowl in the ground position bifurcates the processing volume to form an inner volume of the processing volume isolated from an outer volume of the processing volume.

17. The chamber of claim 16, further comprising a radio frequency (RF) source coupled to an electrode disposed within the pedestal through a RF matching circuit electrically coupled to the electrode by a conductive rod disposed through the hub and the stem.

18. The chamber of claim 17, further comprising a faceplate disposed vertically above the pedestal.

19. The chamber of claim 18, wherein the bottom bowl in the ground position contacts the pumping plate of the chamber to form a primary RF cage for RF energy to propagate from the faceplate to the RF matching circuit.

20. The chamber of claim 15, wherein the ground bowl in the lowered position and the bottom bowl in the transfer position facilitate transfer of a substrate to and from the processing volume through a slit valve formed though the chamber body.

* * * * *